United States Patent [19]

Kobayashi et al.

[11] Patent Number: 4,784,361
[45] Date of Patent: Nov. 15, 1988

[54] AUTOMOTIVE ELECTRONIC DEVICE MOUNTING ASSEMBLY

[75] Inventors: Shigetoshi Kobayashi; Seishichi Ohara; Terunobu Chiba; Tomoji Yoshida, all of Tokyo, Japan

[73] Assignee: Clarion Co., Ltd., Tokyo, Japan

[21] Appl. No.: 61,056

[22] Filed: Jun. 10, 1987

[30] Foreign Application Priority Data

Jun. 17, 1986 [JP] Japan .......................... 61-91342[U]

[51] Int. Cl.⁴ .......................................... F16M 13/00
[52] U.S. Cl. .................................. 248/551; 248/27.3; 248/222.1; 292/86
[58] Field of Search ............. 248/551, 552, 553, 27.3, 248/222.1; 292/86, 85, 83; 403/20, 327, 329, 325; 312/7.1

[56] References Cited

U.S. PATENT DOCUMENTS

| | | | |
|---|---|---|---|
| 2,577,528 | 12/1951 | Kennedy | 312/7.1 |
| 2,804,326 | 8/1957 | Newcomer, Jr. | 292/83 |
| 3,522,963 | 8/1970 | Farnden | 292/86 X |
| 3,993,278 | 11/1976 | Race | 248/551 |
| 4,660,789 | 4/1987 | Putnam | 248/27.3 |
| 4,687,172 | 8/1987 | Stillback | 248/551 |

FOREIGN PATENT DOCUMENTS 2903176 7/1980 Fed. Rep. of Germany ..... 248/27.3

*Primary Examiner*—Ramon S. Britts
*Assistant Examiner*—David L. Talbott
*Attorney, Agent, or Firm*—Flynn, Thiel, Boutell & Tanis

[57] ABSTRACT

A car electronic device mounting assembly for mounting a car stereo or other car electronic device in a mounting aperture provided in a car body comprises a rectangular, hollow bracket fixed in the mounting aperture and having an engage hole formed in its side wall, lock claws provided on the car electronic device to engage the engage hole to hold the car device immovable with respect to the bracket, and an unlocking bar configured to resiliently retract the lock claws from the engage hole into the interior of the electronic device to unlock the electronic device from the bracket.

11 Claims, 4 Drawing Sheets

AUTOMOTIVE ELECTRONIC DEVICE MOUNTING ASSEMBLY

FIELD OF THE INVENTION

This invention relates to an assembly including a bracket fixed to a mounting aperture in a front panel or console box of a car to support there a car stereo, preamplifier or other automotive electronic device, and more particularly to an assembly permitting a user to readily remove the electronic device from the bracket to bring it away from the car with him for antitheft purpose.

BACKGROUND OF THE INVENTION

A prior art mounting assembly is shown in FIG. 5, in which a car stereo or other automotive electronic device 21 is mounted in a rectangular, hollow bracket 22. A mounting aperture 23 originally provided in a car is 53 mm high and 182 mm wide, which is a uniform size according to the ISO or IDN standard. The standard mounting aperture 23 is formed in a front panel 24 of a car. The bracket 22 which can be attached to the automotive electronic device 21 is inserted in the mounting aperture 23, and engage claws 25 formed on the bracket 22 are bent to fix the bracket to the mounting aperture 23. Subsequently, the electronic device 21 is inserted in the bracket 22, and claw-shaped plate springs 26 formed on the electronic device 21 engage mounting holes 27 formed at both ends of the bracket 22 to fix the electronic device 2 within the mounting aperture 23.

To remove the electronic device 21, a specific tool 28 is inserted in slits at both sides of the electronic device 21 to resiliently retract the plate springs 26 from engagement with the bracket 22 and is subsequently used to pull out the device 21 from the bracket 22.

A further prior art mounting assembly has been proposed in Japanese Utility Model Application No. 61-42995 in the name of the assignee of this application. According to the assembly, a carrying handle itself is provided with a releasable locking mechanism and, when pulled out, releases engagement between the bracket and the plate springs, so that the electronic device can be readily removed or mounted without using any particular tool as in the aforegoing prior art assembly.

The former prior art assembly is configured so that the plate springs 26 in engagement with the bracket 22 project into the interior of the bracket 22, as shown in FIG. 5. Therefore, the device 21 cannot be removed from the bracket unless the plate springs 26 retract into the interior of the device 21, and this requires a specific tool having a particular configuration. If any other tool is forcibly used, it often damages the peripheral margin of the mounting aperture, i.e. the front panel 24.

The latter prior art assembly certainly facilitates removal of the device 21 from the bracket. However, it involves a problem in that the device 21 jumps out of the bracket upon a traffic accident or other strong impulse and often injures a human body.

OBJECT OF THE INVENTION

It is therefore an object of the invention to provide a mounting assembly which permits a user to readily remove a device from a bracket in a one-touch fashion not requiring any particular tool so that the user may bring the device with him for antitheft purpose when he leaves the car.

SUMMARY OF THE INVENTION

According to the invention, there is provided an assembly for mounting a car electronic device comprising:

a rectangular, hollow bracket fixed in a mounting aperture provided in a car;

an engage hole formed in at least one side wall of said bracket;

an engage member provided on one side of a car electronic device to be mounted in said bracket;

lock claws and engage portions both provided on said engage member, said lock claws engaging said engage hole to lock the car electronic device with respect to said bracket when the former is inserted in the latter;

an unlocking bar configured to unlock engagement between said lock claws and said engage hole when said car electronic device is inserted in the bracket; and engage projections which are formed on said unlocking bar to engage said engage portions and can hold said engage member at its unlocking position.

Each lock claw may have a tapered end, and the unlocking bar may be biased by a resilient member to an inoperative position.

With this arrangement, the lock claws of the device engage the engage holes in the vertical walls of the bracket to hold the device immovable. When the unlocking bar is pushed, the lock claws retract into the interior of the device from the engage holes to allow a user to pull out the device from the bracket. After the device is removed from the bracket, the lock claws resiliently return to their projecting positions. When the device is inserted again in the bracket, the lock claws are resiliently pushed into the interior of the device by slidably opposed surfaces of the bracket vertical wall. When the lock claws are opposed to the engage holes of the bracket, they become free from the pressure by the bracket wall and spring out from the interior of the device and engagingly enter the engage holes of the bracket. Thus the device is held in the bracket immovably.

DETAILED DESCRIPTION

Figure 1:
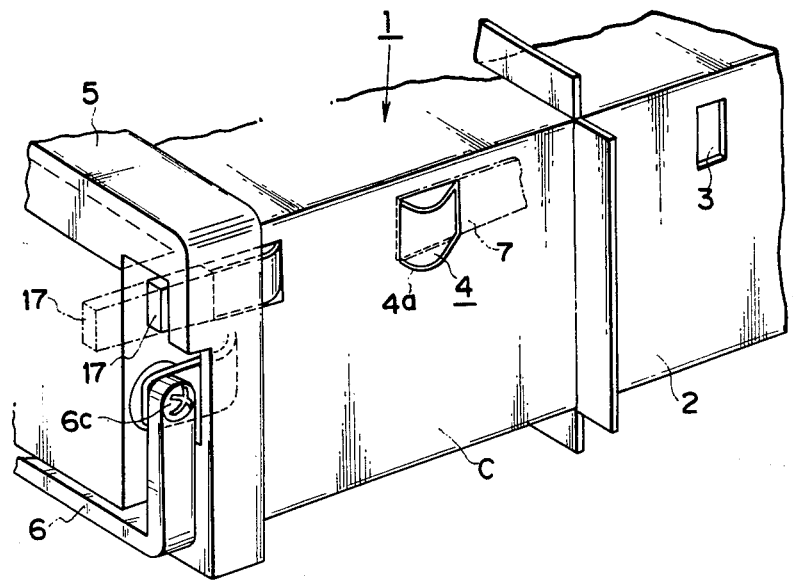
FIG. 1 is a perspective view showing an embodiment of the invention.

The invention is described below, referring to a preferred embodiment illustrated in the drawings.

Figure 2:
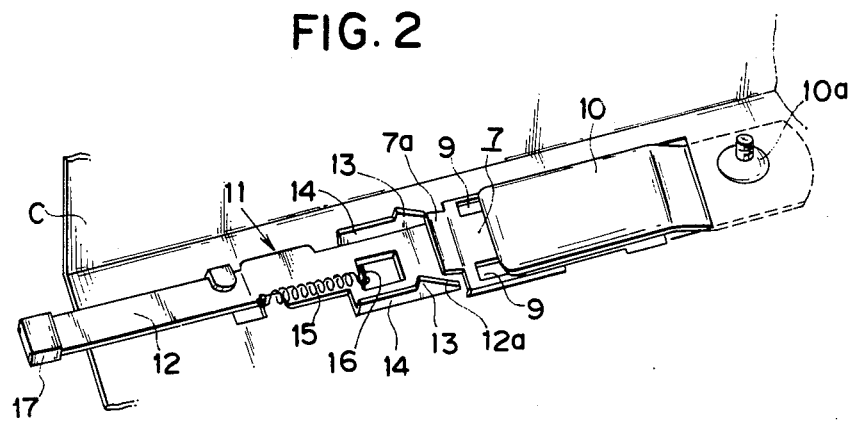
FIG. 2 is a perspective view, taken from the bottom of members in the embodiment of FIG. 1.
Figure 3:
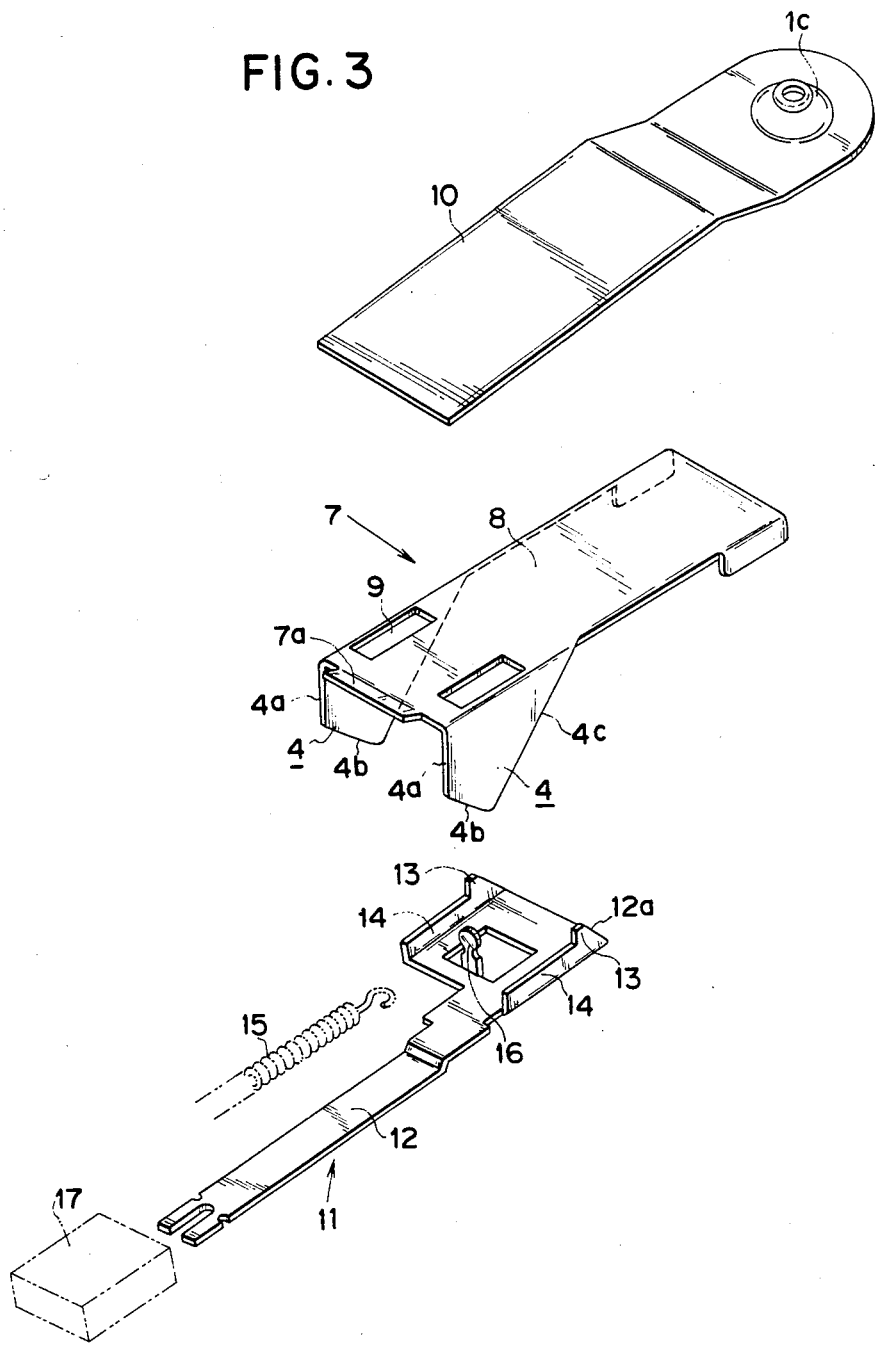
FIG. 3 is an exploded, perspective view of members in the same embodiment.
Figure 4A:
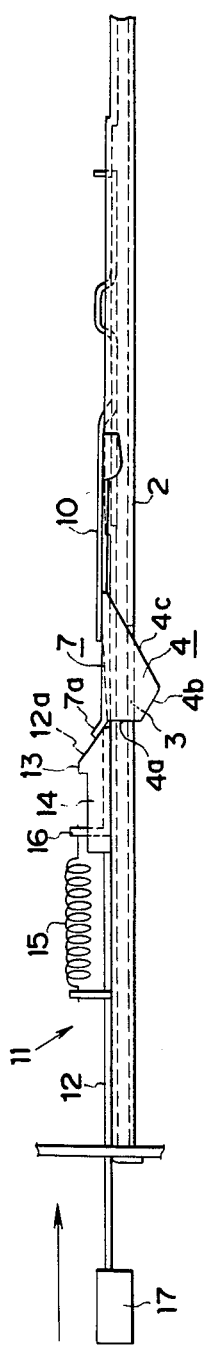
FIGS. 4(a) through 4(c) are side elevations of different operational positions of the members in the same embodiment.
Figure 4B:
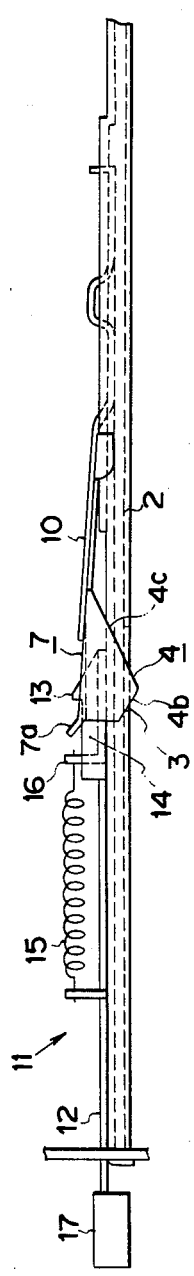
Figure 4C:
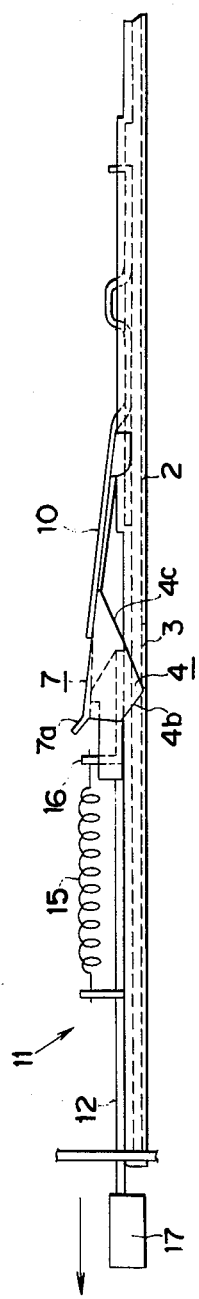
Figure 5:
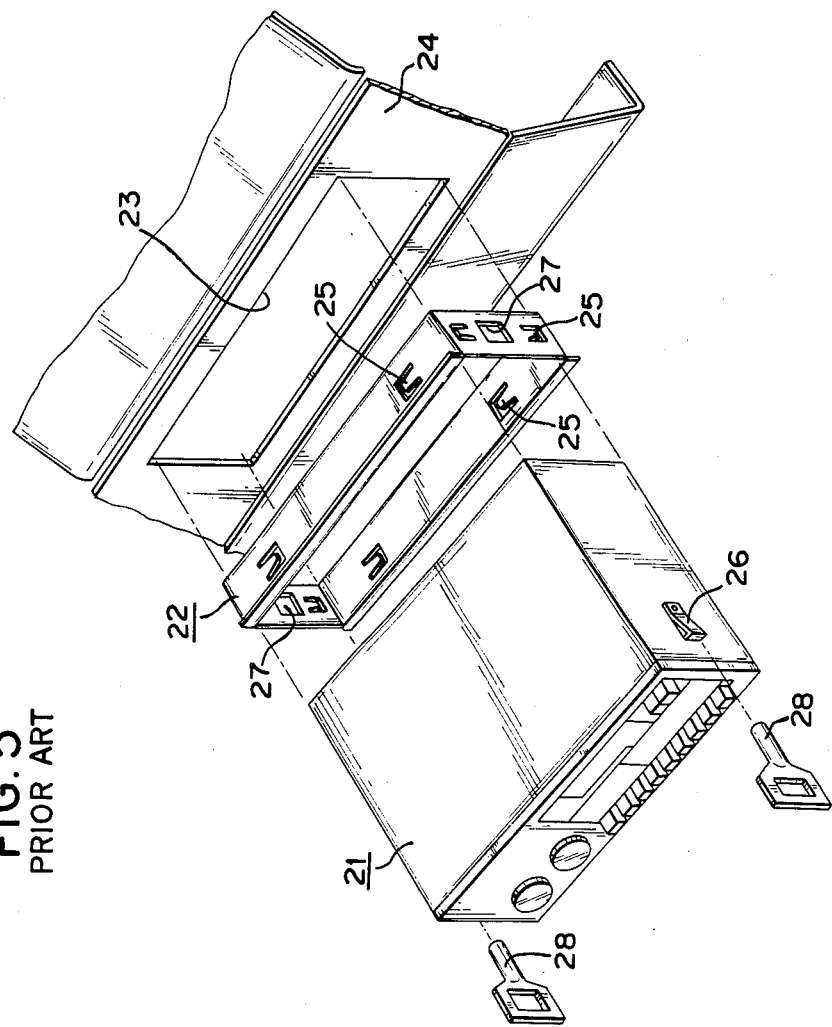
FIG. 5 is a perspective view of a prior art assembly.

FIG. 1 is a perspective view of a mounting assembly embodying the invention, FIG. 2 is a perspective view, taken from the bottom, of members in the same embodiment, FIG. 3 is an exploded, perspective view of an unlocking mechanism in the same embodiment, and FIGS. 4(a) through 4(c) are side elevations showing different operational positions of the same embodiment.

The inventive mounting assembly is used exclusively on the right side of the device 1 as seen from the front face of the device 1, so as to hold the device 1 in a bracket 2 by engagement between lock claws 4 of the device 1 and an engage hole 3 of the bracket 2. Each lock claw 4 has an engage end 4a at its front end for engagement with the front end of the engage hole 3 to prevent the lock claw from dropping out of the engage hole 3 upon a traffic accident or other external force beyond a predetermined magnitude. An escutcheon 5 pivotably supports a handle 6.

Both vertical walls of the bracket 2 are provided with engage holes 3, and the bracket 2 is fixed to a mounting aperture of a car in the same fashion as in the prior art assembly.

The escutcheon 5 is fixed to the front face of the device 1, and has shafts 6c at both sides thereof to pivotably support the handle 6. The handle 6 is normally disposed in a vertical configuration in the car as shown in FIG. 1. At one side of the escutcheon 5 is provided an engage member 7 having lock claws or engage projections 4. The engage member 7 has a front end plate 7a bent and extending upward, and the substantially triangular or trapezoidal lock claws 4 are at both sides thereof. Each lock claw 4 includes an engage end 4a which is its front end (near to the escutcheon 5), which extends vertically downwardly, and which merges into a slope gently sloped edge 4b which in turn merges into an angled edge 4c. Adjacent each lock claw 4, is a base plate 8 of the engage member 7, is provided an engage hole or holding hole 9, and the lock claws 4 and base plate 8 form a U-shaped channel configuration.

A resilient planar member 10 is provided at one side of the engage member 7, maintaining a parallel positional relationship with the engage member 7, and always biases the engage member 7 by pressing on it.

The resilient member 10 has a recess 10a to accept the head of a stud which would otherwise project into the bracket 2. The stud fixes the resilient member 10 to the device 1. An unlocking bar 11 is movably supported near the lock claws 4.

The unlocking bar 11 has a base plate 12 whose distal end is wider than the remainder thereof. At both sides of the wide end are formed engage plates 14 each having an engage projection 13 or holding projection. The base plate 12 has a claw 16 supporting one end of a coil spring 15 which is used as a resilient member described later.

For removal of the device 1, a release button 17 provided on the front face of the escutcheon is pushed. Responsively, the unlocking bar 11 advances (FIG. 4A) against the energy of the coil spring 15 which extends between a case C of the device 1 and the claw 16, and the base plate 8 of the engage member 7 bridging the lock claws 4 is resiliently deformed along angled edges 12a at the distal end of the unlocking bar 11, so that the engage ends 4a of the lock claws 4 disengage from the engage hole 3. Concurrently, the engage projections 13 engage the engage holes 9 to lock the unlocking bar 11 in this configuration (FIG. 4B).

Subsequently, when the handle 6 secured to the device 1 is rotated up to a horizontal configuration and pulled, the lock claws 4 are pushed into the interior of the device 1 by their ends 4b sliding along the front end of the engage hole 3 (FIG. 4c), and enable removal of the device 1 from the bracket 2. Simultaneously, as shown in FIG. 4c, the projections 13 disengage from the holes 9 and the spring 15 moves the member 12 leftwardly to its original position.

Soon after the device 1 is removed from the bracket 2, i.e. after the lock claws 4 become free from frictional engagement with the opposed bracket walls 2, the lock claws 4 are moved to again project outwardly from the exterior of the case C by the energy of the resilient member 10.

On mounting the device 1 in the bracket 2, all the user has to do is insert of the device 1 into the bracket 2. More specifically, the angled edges 4c of the lock claws 4 contact the wall surfaces of the bracket 2, forcing the lock claws 4 to move into the interior of the device 1 as the device 1 is inserted into the interior of the bracket 2. When the lock claws 4 biased by the resilient member 10 reach the engage hole 3, they move outwardly and enter the engage hole 3 to hold the device 1 in the bracket 2 immovably in either direction.

As described above, the inventive mounting assembly greatly facilitates removal of the device. That is, a user can pull out the device from the bracket, by gripping the handle, after merely pushing the pushbutton on the front face of the device to automatically unlock the device from the bracket. After removal of the device, the unlocking bar is automatically returned by the resilient member to its original configuration taken in the inserted condition.

The inventive mounting assembly also facilitates and ensures fixture of the device in the bracket. The engage mechanism reliably, automatically fixes the device 1 when a user merely insert the device 1 into the bracket.

Therefore, the inventive arrangement greatly facilitates fixture and removal of the device with respect to the bracket, without requiring any particular tool, and hence alleviates a user's hesitation in carrying the device with him for antitheft purpose when he leaves the car. This not only prevents robbery theft of the device but also prevents various damages in the interior room of the car during the theft.

What is claimed is:

1. An apparatus comprising a rectangular hollow bracket adapted to be mounted in a car passenger compartment, a car electronic device which can be slidably inserted into and removed from said bracket substantially parallel to an insertion direction, and means for releasably securing said electronic device in said bracket, the improvement comprising wherein said means for releasably securing said device includes:

an engage hole formed in a side wall of said bracket;
an engage member provided on a side of said electronic device and having an engage projection movable relative to said device transversely of said insertion direction between first and second positions in which said engage projection is respectively engaged with and spaced from said engage hole, and biasing means for yieldably biasing said engage projection toward its first position, wherein engagement of said engage projection in said engage hole when said engage projection is in its first position prevents removal of said electronic device from said bracket;
an unlocking member supported on said electronic device for movement between first and second positions and having means responsive to movement of said unlocking member from its first position to its second position for forcibly moving said engage member from its first position to a third position located between its first and second positions;

resilient means for yieldably biasing said unlocking member toward said first position thereof; and holding projections provided on said unlocking member and means on said engage member engageable with said holding projections on said unlocking member when said unlocking member is in its second position and said engage projection is in its third position for releasably holding said unlocking member in its second position, movement of said engage member to its second position interrupting said engagement of said holding projections and said means on said engage member.

2. An apparatus according to claim 1, wherein as said electronic device is removed from said bracket, said engage projection engages said side wall of said bracket and is moved from its third to its second position by said side wall, and wherein when said engage projection is in its second position said holding projections on said unlocking member are disengaged from said means on said engage member cooperable therewith so that said unlocking member is returned to its first position by said resilient means.

3. An apparatus according to claim 1, wherein said unlocking member has at one end thereof a button member which can be manually pressed in order to facilitate movement of said unlocking member from its first to its second position.

4. An apparatus according to claim 1, wherein said biasing means is a plate spring which engages said engage member.

5. An apparatus comprising a bracket unit, a car electronic unit disposed in said bracket unit and slidably removable therefrom in a withdrawal direction, and means for releasably securing said electronic unit against removal from said bracket unit, said means for releasably securing including: an engage member having thereon an engage projection and supported on one of said bracket unit and said electronic unit for movement in a further direction transverse to said withdrawal direction from a first position to a second position through a third position; biasing means for yieldably urging said engage member toward its first position; first means for preventing movement of said car electronic unit in said withdrawal direction relative to said bracket unit when said engage member is in its first position; second means responsive to removal of said electronic unit from said bracket unit in said withdrawal direction when said engage member is in its third position for effecting movement of said engage member to its second position; an unlocking member supported on said one of said units for movement between first and second positions; resilient means for yieldably urging said unlocking member toward its first position; third means responsive to movement of said unlocking member from its first position to its second position for moving said engage member from its first position to its third position; and fourth means for releasably holding said unlocking member in its second position when said engage member is in its third position and for releasing said unlocking member when said engage member is thereafter moved to its second position, said fourth means including said unlocking member having a holding projection thereon which extends transversely to the directions for movement of said unlocking member and including said engage member having therein a holding hole which respectively receives and is spaced from said projection on said unlocking member when said unlocking member is in its second position and said engage member is respectively in its third and second positions.

6. An apparatus according to claim 5, wherein said first means includes said engage member which is movably supported on said one of said units having on said engage projection thereof an engage surface which extends transversely to said withdrawal direction, said first means further including the other of said units having a portion which faces in a direction opposite said withdrawal direction and which is engageable with said engage surface when said engage member is in its first position.

7. An apparatus according to claim 6, wherein said second means includes an angled surface which is located adjacent an outer end of said engage projection on said engage member, which extends at an angle with respect to said withdrawal direction, and which slidably engages said portion on said other of said units when said engage member is in its third position as said electronic unit is being withdrawn from said bracket unit.

8. An apparatus according to claim 7, wherein said unlocking member moves between its first and second positions in directions approximately parallel to said withdrawal direction, and wherein said third means includes said unlocking member having thereon an angled edge which forms an angle with respect to said withdrawal direction and which slidably engages said engage member as said unlocking member is moved from its first position to its second position.

9. An apparatus according to claim 8, wherein said bias means includes a leaf spring having a first end fixedly secured to said one of said units and having a second end disposed against said engage member.

10. An apparatus according to claim 9, wherein said fourth means includes said unlocking member having thereon two of said holding projections and includes said engage member having therein two of said holding holes which are each cooperable with a respective said holding projection; wherein said engage member includes two said engage projections and a base plate portion which extends between said engage projections, said holding holes each being provided in said base plate portion adjacent a respective one of said engage projections; and wherein said other of said units has therein an engage hole, said portion of said other of said units being an edge portion thereof bounding said engage hole.

11. An apparatus according to claim 10, wherein said one of said units is said electronic unit and said other of said units is said bracket unit.

* * * * *